United States Patent
Sirocka et al.

(10) Patent No.: US 11,074,970 B2
(45) Date of Patent: Jul. 27, 2021

(54) MUX DECODER WITH POLARITY TRANSITION CAPABILITY

(71) Applicant: Micron Technology, Inc., Boise, ID (US)

(72) Inventors: Nathan Joseph Sirocka, Loomis, CA (US); Mingdong Cui, Folsom, CA (US); Jeffrey Edward Koelling, Fairview, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/668,549

(22) Filed: Oct. 30, 2019

(65) Prior Publication Data

US 2021/0134363 A1    May 6, 2021

(51) Int. Cl.
  *G11C 11/00*    (2006.01)
  *G11C 13/00*    (2006.01)

(52) U.S. Cl.
  CPC ........ *G11C 13/0023* (2013.01); *G11C 13/003* (2013.01); *G11C 13/0004* (2013.01)

(58) Field of Classification Search
  CPC .............. G11C 13/0023; G11C 13/003; G11C 13/0004
  USPC .......................................................... 365/148
  See application file for complete search history.

(56) References Cited

U.S. PATENT DOCUMENTS

| 7,342,838 | B1 * | 3/2008 | Sharpe-Geisler ............................ G06F 13/4243 326/39 |
| 2005/0200587 | A1 * | 9/2005 | Hwang ................ G09G 3/3648 345/96 |
| 2007/0058425 | A1 | 3/2007 | Cho et al. |
| 2007/0201267 | A1 | 8/2007 | Happ et al. |
| 2010/0165702 | A1 | 7/2010 | Toda |
| 2013/0010527 | A1 | 1/2013 | Ma et al. |
| 2014/0197847 | A1 | 7/2014 | Baker |
| 2015/0002503 | A1 * | 1/2015 | Park .................... G09G 3/3688 345/212 |

OTHER PUBLICATIONS

International Search Report and Written Opinion, PCT/US2020/056941, dated Jan. 29, 2021.

* cited by examiner

*Primary Examiner* — Vu A Le
(74) *Attorney, Agent, or Firm* — Greenberg Traurig

(57) ABSTRACT

A decoder in an integrated circuit memory device having: a positive section having a first input line; a negative section having a second input line; and an output line connected from both the positive section and the negative section to a voltage driver connected to a memory cell. The positive section and the negative sections are controlled by a polarity control signal. When the polarity control signal indicates positive polarity, the positive section drives the output line according to signals received in the first input line; and when the polarity control signal indicates negative polarity, the negative section drives the output line according to signals received in the second input line.

17 Claims, 8 Drawing Sheets

MUX DECODER WITH POLARITY TRANSITION CAPABILITY

FIELD OF THE TECHNOLOGY

At least some embodiments disclosed herein relate to decoders to generate control signals for voltage drivers in integrated circuit memory in general and more particularly, but not limited to, control signals having opposite polarities.

BACKGROUND

A memory integrated circuit can have one or more arrays of memory cells formed on an integrated circuit die of semiconducting material. A memory cell is a smallest unit of memory that can be individually used or operated upon to store data. In general, a memory cell can store one or more bits of data.

Different types of memory cells have been developed for memory integrated circuits, such as random access memory (RAM), read-only memory (ROM), dynamic random access memory (DRAM), static random access memory (SRAM), synchronous dynamic random access memory (SDRAM), phase change memory (PCM), magneto random access memory (MRAM), negative-or (NOR) flash memory, electrically erasable programmable read-only memory (EEPROM), flash memory, etc.

Some integrated circuit memory cells are volatile and require power to maintain data stored in the cells. Examples of volatile memory include Dynamic Random-Access Memory (DRAM) and Static Random-Access Memory (SRAM).

Some integrated circuit memory cells are non-volatile and can retain stored data even when not powered. Examples of non-volatile memory include flash memory, Read-Only Memory (ROM), Programmable Read-Only Memory (PROM), Erasable Programmable Read-Only Memory (EPROM) and Electronically Erasable Programmable Read-Only Memory (EEPROM) memory, etc. Flash memory includes negative-and (NAND) type flash memory or a negative-or (NOR) type flash memory. A NAND memory cell is based on a NAND logic gate; and a NOR memory cell is based on a NOR logic gate.

Cross-point memory (e.g., 3D XPoint memory) uses an array of non-volatile memory cells. The memory cells in cross-point memory are transistor-less. Each of such memory cells can have a phase-change memory device and a select device that are stacked together as a column in an integrated circuit. Memory cells of such columns are connected in the integrated circuit via two layers of wires running in directions that are perpendicular to each other. One of the two layers is above the memory cells; and the other layer is below the memory element columns. Thus, each memory cell can be individually selected at a cross point of one wire on each of the two layers. Cross point memory devices are fast and non-volatile and can be used as a unified memory pool for processing and storage.

A non-volatile integrated circuit memory cell can be programmed to store data by applying one voltage or a pattern of voltage to the memory cell during a program/write operation. The program/write operation sets the memory cell in a state that corresponds to the data being programmed/stored into the memory cell. The data stored in the memory cell can be retrieved in a read operation by examining the state of the memory cell. The read operation determines the state of the memory cell by applying a voltage and determine whether the memory cell becomes conductive at a voltage corresponding to a pre-defined state.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
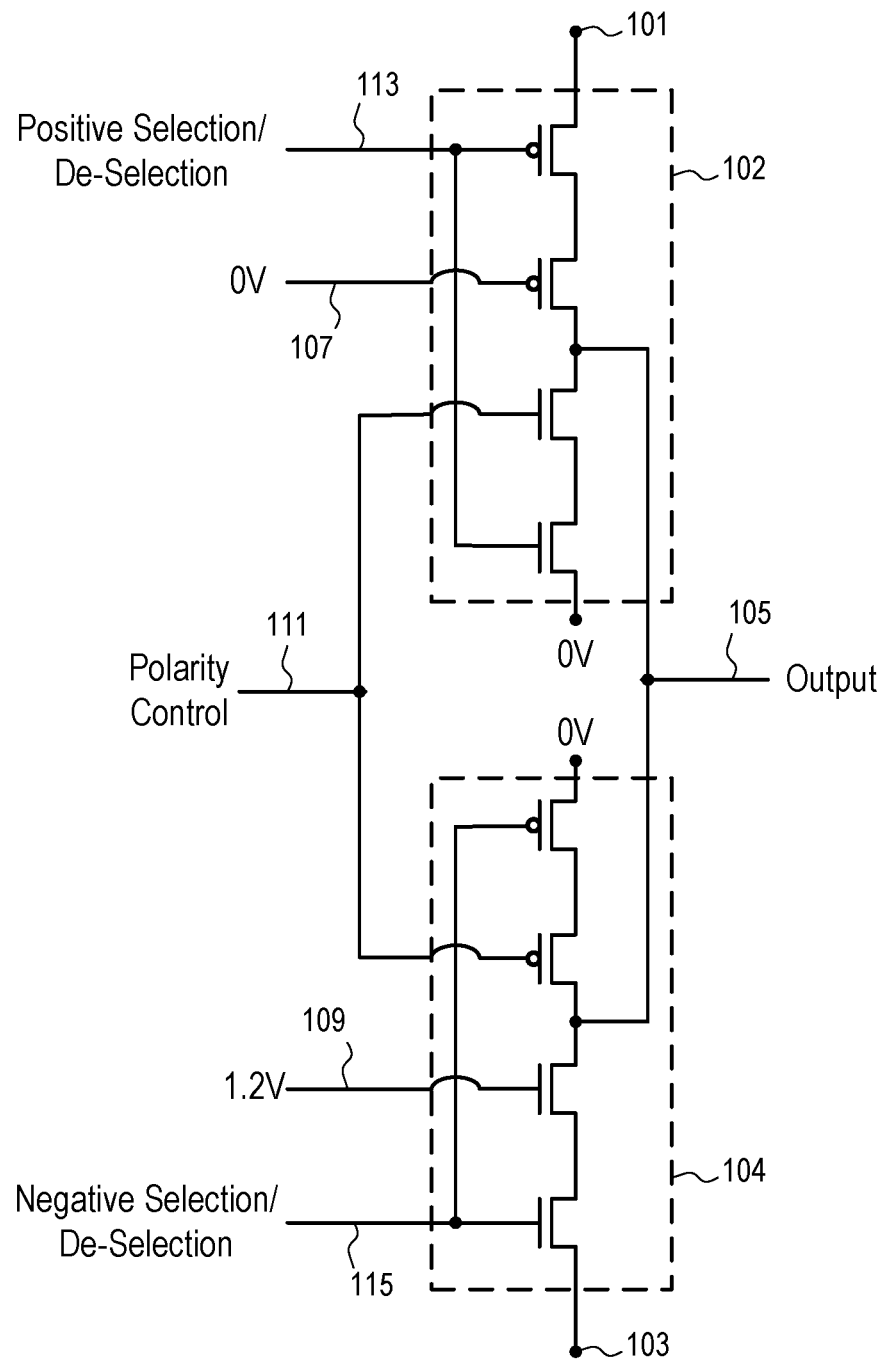
FIG. 1 shows a mux decoder configured to generate control signals for a bi-polar voltage driver according to one embodiment.

At least some embodiments disclosed herein provide systems, methods and apparatus to generate bi-polar control signals for voltage drivers in integrated circuit memory.

In some implementations, cross point memory can use a memory cell that has a select device but no phase-change memory device. For example, the memory cell can be a single piece of alloy with variable threshold capability. The read/write operations of such a cell can be based on thresholding the cell while inhibiting other cells in subthreshold bias, in a way similar to the read/write operations for a memory cell having a select device and a phase-change memory device that are stacked together as a column.

Such a memory cell, having a select device but no phase-change memory device, can be programmed in cross point memory to have a threshold voltage window. The threshold voltage window can be created by applying programming pulses with opposite polarity to the select device. For example, the select device can be biased to have a positive voltage difference between two sides of the select device and alternatively, to have a negative voltage difference between the same two sides of the select device. When the positive voltage difference is considered in positive polarity, the negative voltage difference is considered in negative polarity that is opposite to the positive polarity. Reading can be performed with a given/fixed polarity. When programmed, the memory cell has a threshold lower than the cell that has been reset, such that during a read operation, the read voltage can cause a programmed cell to become conductive while a reset cell remains non-conductive.

A voltage driver can be controlled by signals of various voltages to drive programming pulses with opposite polarity. The voltage driver can be configured to drive a selection voltage in response to a control signal of a first voltage, and a selection voltage in opposite polarity in response to a control signal of a second voltage. Similarly, the voltage driver can be configured to drive a de-selection voltage in response to a control signal of a third voltage, and a de-selection voltage in opposite polarity in response to a control signal of a fourth voltage. The voltage range among the first, second, third and fourth voltages for the control signals can be as high as 9V.

A mux decoder can be configured to have two sections operating under different voltage ranges. A polarity control signal is used to select which of the two sections is currently being used to generate the output of the decode. Each of the sections is configured to receive an input signal for selection/de-selection in a corresponding polarity. The input signal can be limited to a voltage range no greater than 5.5V. The section currently selected by the polarity control signal generates its output in accordance with the voltage of the input signal.

The mux decoder uses no local level shifting and thus saves area on the integrate circuit die. The mux decoder does not require pre-charge and thus is fast in operation. The mux decoder does not apply more than 5.5V across any of its MOSFET (Metal-Oxide-Semiconductor Field-Effect Transistor) devices and thus can be implemented using MOSFET devices that have a voltage limit of 5.5V. However, it is not necessary to implement the mux decoder using MOSFET devices that have a voltage limit of 5.5V. Transistors with higher max voltage limits can also be used in the implementation of the mux decoder.

FIG. 1 shows a mux decoder configured to generate control signals for a bi-polar voltage driver according to one embodiment.

The mux decoder of FIG. 1 has two sections (102 and 104) that are configured to operate under different voltage regions. Predetermined voltages (e.g., 0V at ground) are applied to the sections (102 and 104) at the voltage lines (117 and 119). The voltages applied to the sections (102 and 104) at the voltage lines (101 and 103) respectively are dependent on the operating polarity of the decoder.

Figure 2:
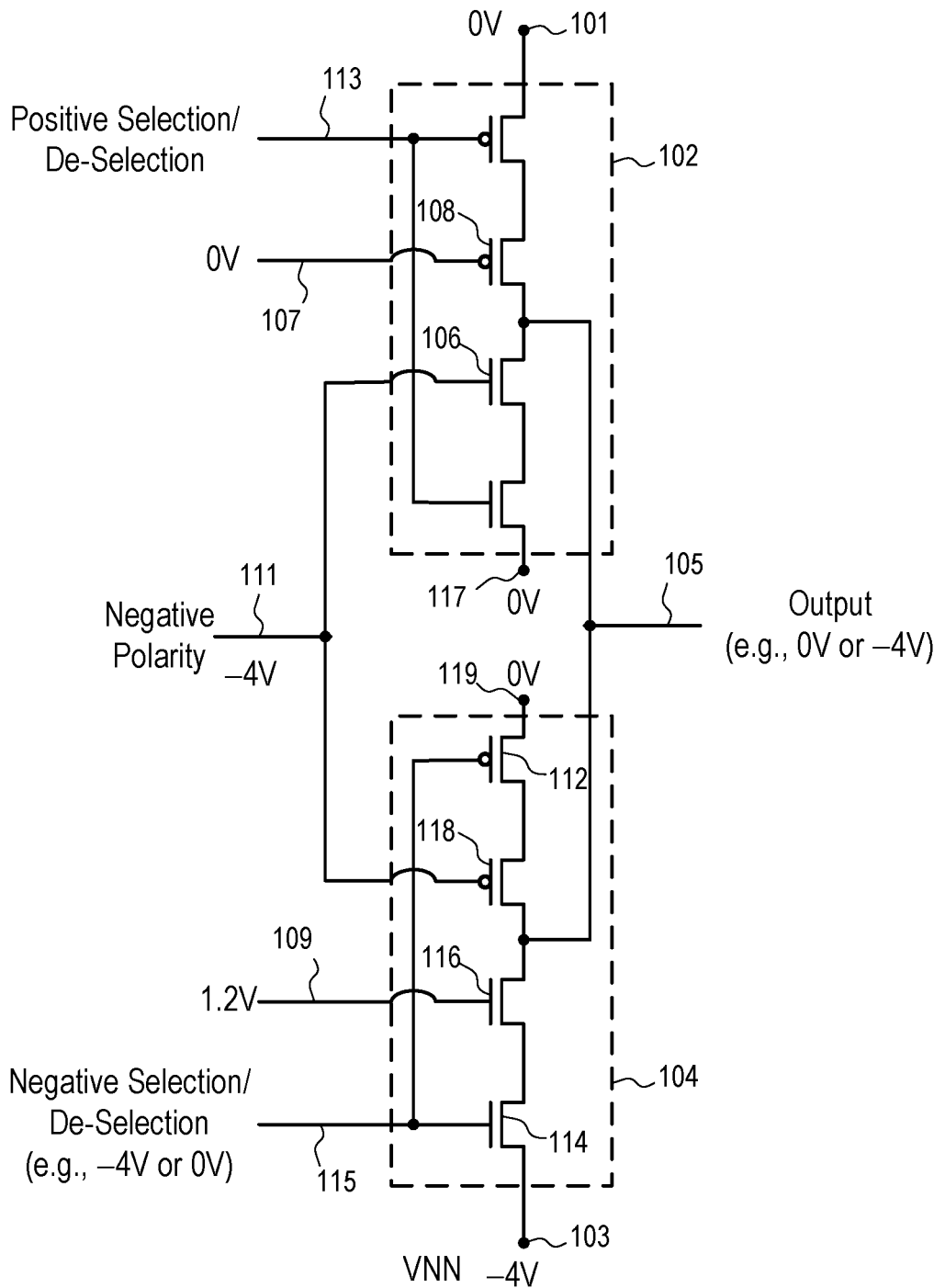
FIGS. 2-3 show configurations of the mux decoder of FIG. 1 operating with negative and positive polarities according to one embodiment.

When the mux decoder of FIG. 1 is operating with negative polarity, the negative section (104) is powered by the negative voltage power supply (e.g., with VNN applied at voltage line (103) at −4V relative to ground at 0V), as illustrated in FIG. 2, while the positive section (102) is not power by the positive voltage power supply (e.g., with the voltage line (101) being connected to the ground at 0V).

Figure 3:
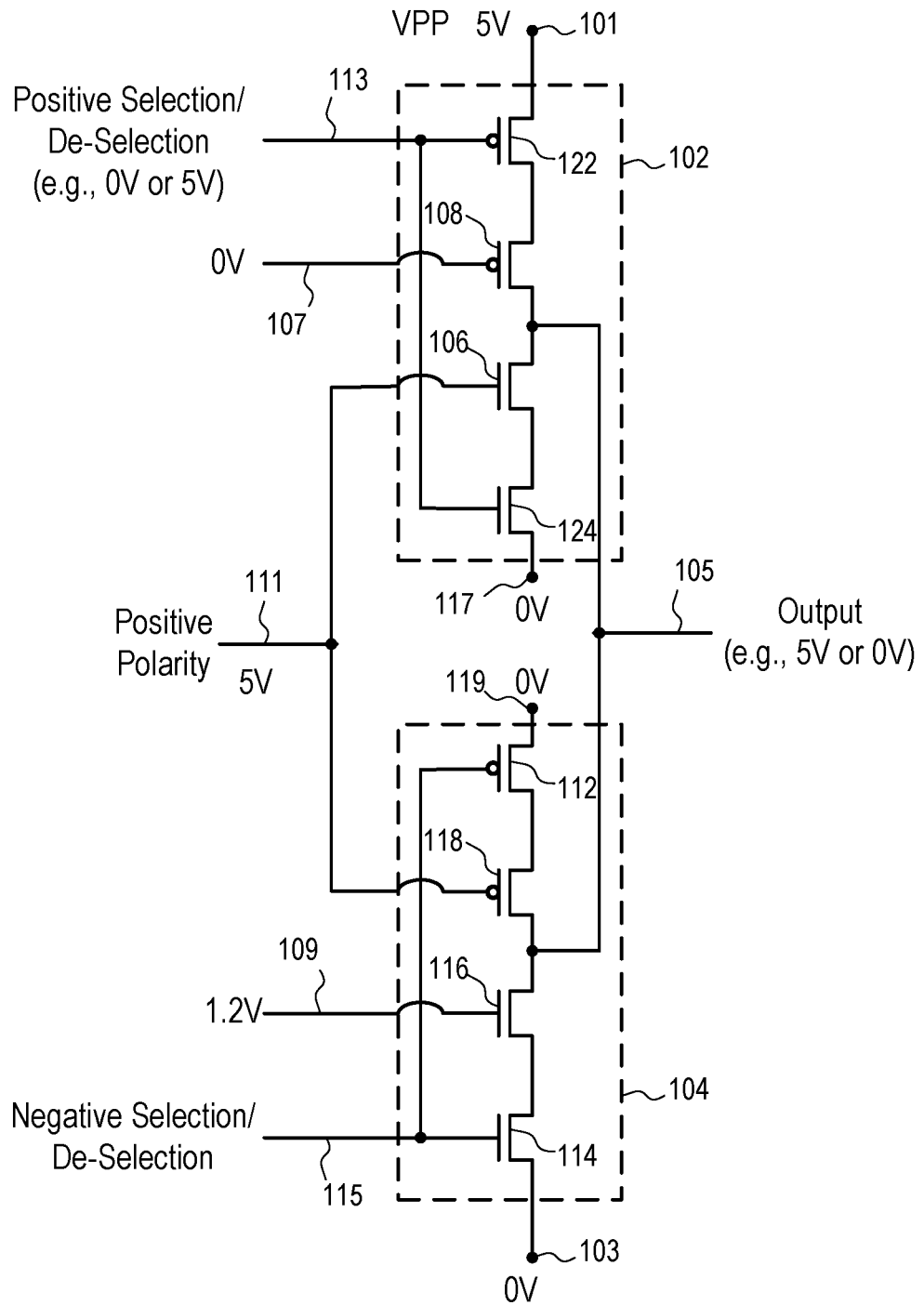

When the mux decoder of FIG. 1 is operating with positive polarity, the positive section (102) is powered by the positive voltage power supply (e.g., with VPP applied at voltage line (101) at 5V relative to ground at 0V), as illustrated in FIG. 3, while the negative section (104) is not power by the negative voltage power supply (e.g., with the voltage line (103) being connected to the ground at 0V).

The negative and positive sections (102 and 104) of the mux decoder of FIG. 1 are biased at predetermined voltages (e.g., at 0V and 1.2V) at the gate control lines (107 and 109) respectively.

The mux decoder of FIG. 1 has an input line (111) to receive a polarity control signal.

For example, when the polarity control signal applies −4V on the input line, as illustrated in FIG. 2, the negative section (104) is configured to generate output to drive the output line (105) according to the selection/de-selection signal of negative polarity applied on the input line (115) of the negative section (104). For example, when the input line (115) receives a voltage of −4V (or 0V) for selection/de-selection, the negative section (104) drives the output line (105) at the voltage of 0V (or −4V).

In the negative polarity configuration of FIG. 2, the positive section (102) operates in the voltage range from −4V to 0V. The low voltage (−4V) applied at the input line (111) and the high voltage (0V) applied at the gate control line (107) of the positive section (102) cause the gates (106 and 108) of the positive section (102) to disconnect the output line (105) from the voltage lines (101 and 117), allowing the negative section (104) to control the output line (105).

In the negative polarity configuration of FIG. 2, the negative section (104) operates in the voltage range from −4V to 1.2V. The low voltage (−4V) applied at the input line (111) and the high voltage (1.2V) applied at the gate control line (109) of the negative section (104) causes the gates (118 and 116) of the negative section (104) to connect the output line (105) to the gates (112 and 114) respectively. When the input line (115) of the negative section (104) receives a high voltage (0V), the output line (105) is further connected to the low voltage (−4V) at the voltage line (103) via the gate (114), but disconnected by the gate (112) from the voltage line (119). When the input line (115) of the negative section (104) receives a low voltage (−4V), the output line (105) is further connected to the high voltage (0V) at the voltage line (119) via the gate (112), but disconnected by the gate (114) from the voltage line (103).

In the positive polarity configuration of FIG. 3, the negative section (104) operates in the voltage range from 0V to 5V. The high voltage (5V) applied at the input line (111) and the low voltage (1.2V) applied at the gate control line (109) of the negative section (104) cause the gates (118 and 116) of the negative section (104) to disconnect the output line (105) from the voltage lines (119 and 103), allowing the positive section (102) to control the output line (105).

In the positive polarity configuration of FIG. 3, the positive section (102) operates in the voltage range from 0V to 5V. The high voltage (5V) applied at the input line (111) and the low voltage (0V) applied at the gate control line (107) of the positive section (102) causes the gates (108 and 106) of the positive section (102) to connect the output line (105) to the gates (122 and 124) respectively. When the input line (113) of the positive section (102) receives a low voltage (0V), the output line (105) is further connected to the high voltage (5V) at the voltage line (101) via the gate (122), but disconnected by the gate (124) from the voltage line (117). When the input line (113) of the positive section (102) receives a high voltage (5V), the output line (105) is further connected to the low voltage (0V) at the voltage line (117) via the gate (124), but disconnected by the gate (122) from the voltage line (101).

Thus, when the polarity control signal applies 5V on the input line (111), the positive section (102) is configured according to FIG. 3 to drive the output line (105) according to the selection/de-selection signal of positive polarity applied on the input line (113) of the positive section (102). For example, when the input line (113) receives a voltage of 0V (or 5V) for selection/de-selection, the positive section (102) drives the output line (115) at the corresponding voltage of 5V (or 0V).

Similarly, when the polarity control signal applies −4V on the input line (111), the negative section (104) is configured according to FIG. 2 to drive the output line (105) according to the selection/de-selection signal of negative polarity applied on the input line (115) of the negative section (104). For example, when the input line (115) receives a voltage of 0V (or −4V) for selection/de-selection, the negative section (104) drives the output line (115) at the corresponding voltage of −4V (or 0V).

Thus, according to the selection of the polarity control at the input line (111), the mux decoder of FIG. 1 selects either the positive section (102) to drive the output line (105) according to the input line (113) of the positive section (102), or the negative section (104) to drive the output line (105) according to the input line (115) of the negative section (104).

The mux decoder of FIG. 1 can generate output voltages −4V, 0V, and 5V. Since the positive voltage power supply (e.g., VPP at 5V) and the negative voltage power supply (e.g., VNN at −4V) are not simultaneously applied to the mux decoder at the voltage lines (101 and 103), the mux decoder can generate the range of voltages between −4V to 5V without applying more than 5.5V across any of its MOSFET devices.

Figure 4:
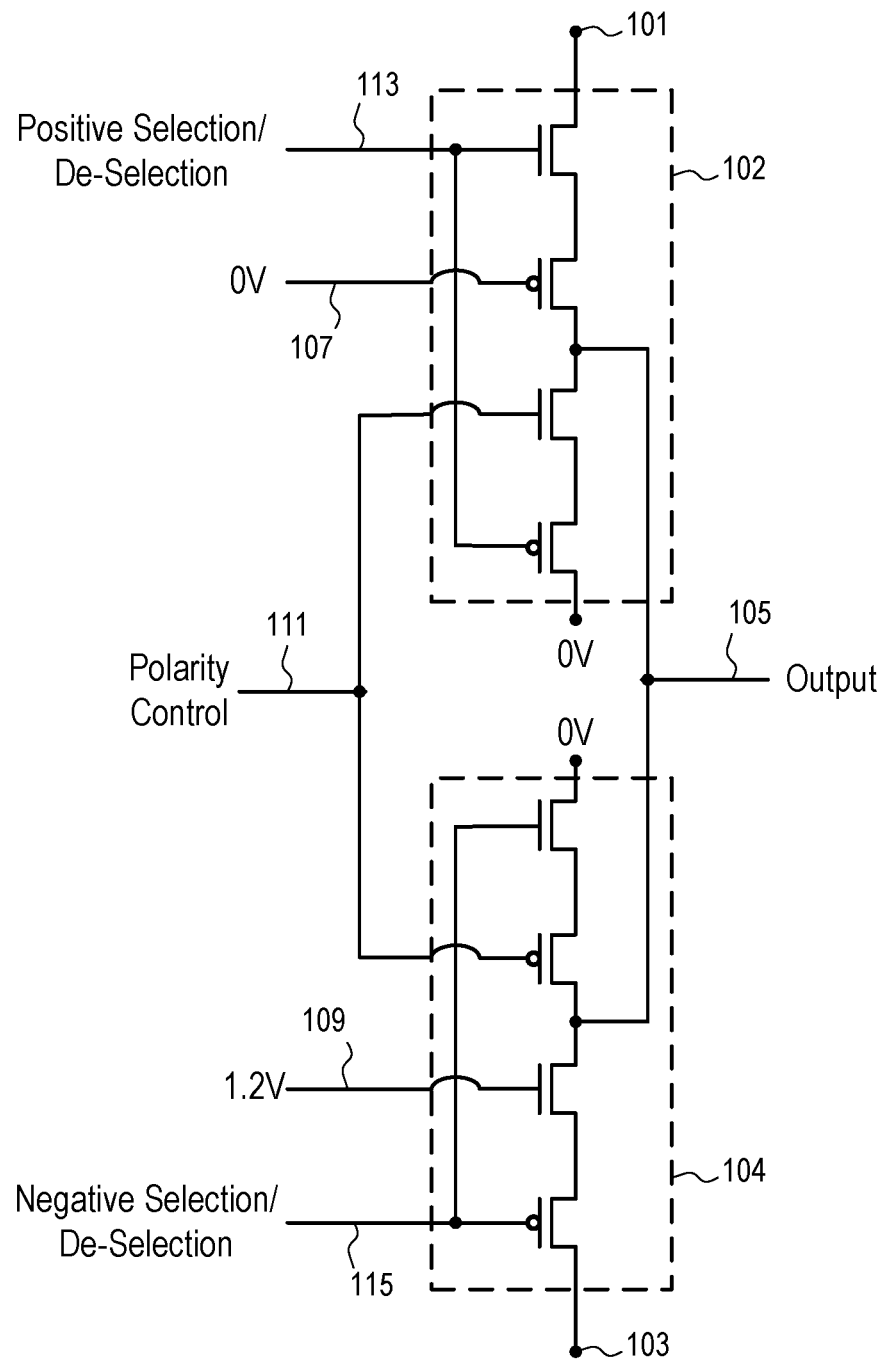
FIGS. 4-6 show variations of the mux decoder of FIG. 1.
Figure 5:
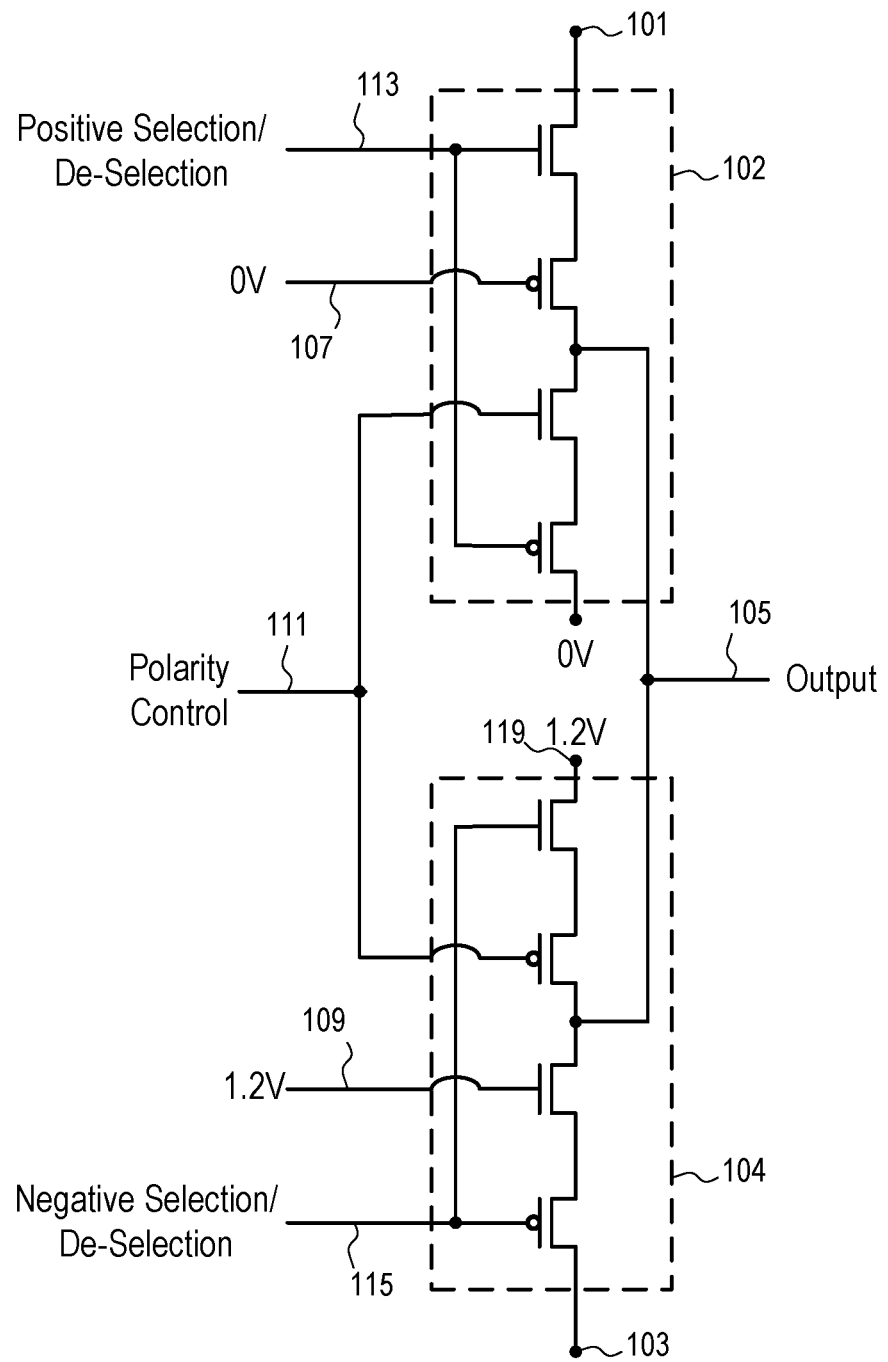
Figure 6:
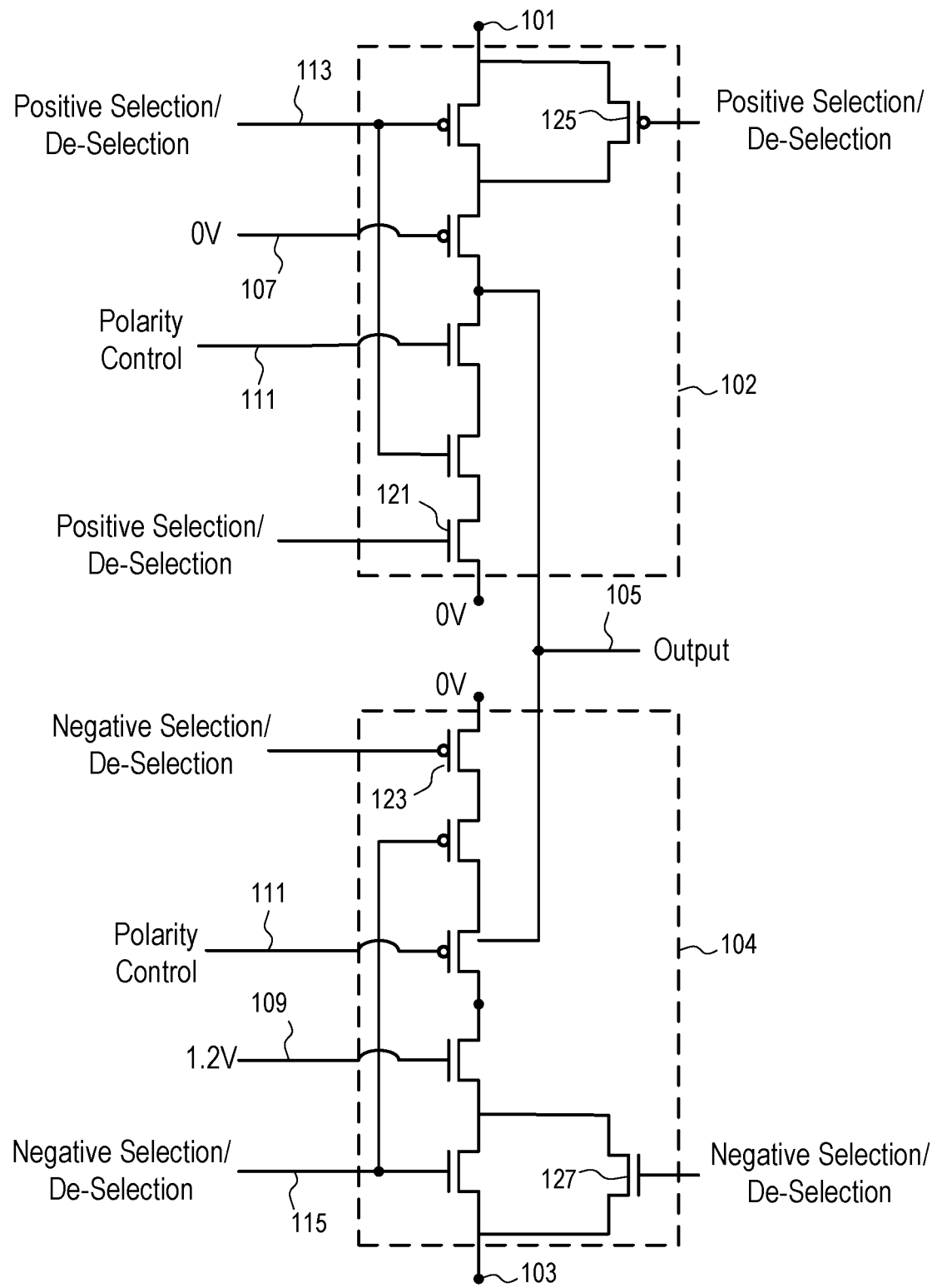

FIGS. 4-6 show variations of the mux decoder of FIG. 1. In FIGS. 4-6, the voltage lines (101 and 103) are selectively connected to VPP (5V), VNN (−4V) or ground, based on polarity control (111), in a way similar to FIGS. 1-3.

In FIG. 1, the signal on the output line (105) is the inverse of the input signals on input lines (113 and 115). For example, when the positive section (102) is in control of the output line (105), a high voltage (5V) on the input line (113) generates a low voltage (0V) on the output line (105); and a low voltage (0V) on the input line (113) generates a high voltage (5V) on the output line (105). Similarly, when the negative section (104) is in control of the output line (105), a high voltage (0V) on the input line (115) generates a low voltage (−4V) on the output line (105); and a low voltage (−4V) on the input line (115) generates a high voltage (0V) on the output line (105).

In the mux decoder of FIG. 4, the signal on the output line (105) corresponds to the input signals on input lines (113 and 115), as if the mux decoder of FIG. 4 selects, based on the polarity control (111), one of the input signals from the input lines (113 and 115) and places the selected signal on the output line (105). For example, when the positive section (102) is in control of the output line (105), a voltage of 5V on the input line (113) generates the same voltage of 5V on the output line (105); and a voltage of 0V on the input line (113) generates the same voltage of 0V on the output line (105). Similarly, when the negative section (104) is in control of the output line (105), a voltage of 0V on the input line (115) generates the same voltage of 0V on the output line (105); and a voltage of −4V on the input line (115) generates the same voltage of −4V on the output line (105).

In the mux decoder of FIG. 5, the voltage line (119) is connected to a predetermined voltage of 1.2V. Thus, when the polarity control (111) selects the negative section (104) to control the output line (105), the voltage on the output line (105) is 1.2V or −4V when the voltage of the negative selection/de-selection on the input line (115) is 0V or −4V respectively (or, 1.2V or −4V respectively).

The mux decoder of FIG. 6 includes additional MOSFET devices (121, 123, 125, 127) that allow the mux decoder to be implemented via NAND gates. Optionally, some of the MOSFET devices (e.g., 121 and 123) can be shared among multiple mux decoders. For example, 8 mux decoders may share a MOSFET device (121) and/or a MOSFET device (123). The NAND variation of FIG. 4 can trade local diffusion area for a reduction in signal routing, as well as diffusion in the bitline and wordline drivers.

Figure 7:
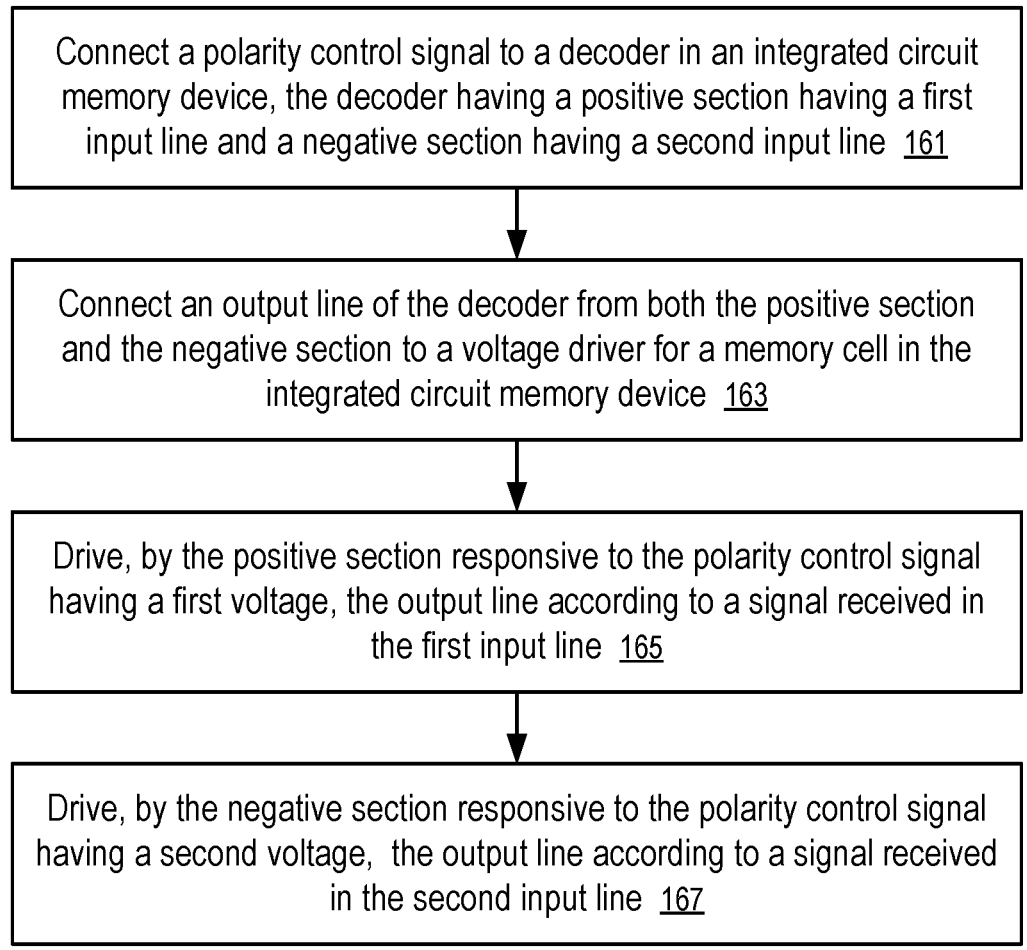
FIG. 7 shows a method to generate control voltages using a mux decoder according to one embodiment.

FIG. 7 shows a method to generate control voltages using a mux decoder according to one embodiment. For example, the method of FIG. 7 can be implemented in a memory device of FIG. 8 using one of the mux decoders illustrated in FIGS. 1-6.

At block 161, a polarity control signal is connected to an input line (111) of a decoder in an integrated circuit memory device. The decoder has a positive section (102) and a negative section (104). The positive section (102) has a first input line (113); and the negative section (104) has a second input line (115).

At block 163, an output line (105) of the decoder connects from both the positive section (102) and the negative section (104) to a voltage driver for a memory cell in the integrated circuit memory device.

For example, the memory cell has a select device and no phase-change memory device; the memory cell is programmable to store data via applying pulses with opposite polarity; and during an operation to read the memory cell, voltages of a predetermined, fixed polarity are applied on the memory cell.

At block 165, responsive to the polarity control signal on the input line (111) having a first voltage (e.g., 5V illustrated in FIG. 3), the positive section (102) drives the output line (105) according to a signal received in the first input line (113).

At block 167, responsive to the polarity control signal on the input line (111) having a second voltage (e.g., −4V illustrated in FIG. 2), the negative section (104) drives the output line (105) according to a signal received in the second input line (115).

The positive section (102) has two voltage lines (101 and 117). When the polarity control signal on the input line (111) has the first voltage (e.g., 5V illustrated in FIG. 3), the voltage lines (101 and 117) of the positive section (102) are powered by a first voltage difference between the first voltage (e.g., 5V) and ground (e.g., 0V).

Similarly, the negative section (104) has two voltage lines (103 and 119). When the polarity control signal on the input line (111) has the second voltage (e.g., −4V illustrated in FIG. 2), the voltage lines (103 and 119) of the negative section (104) are powered by a second voltage difference between the second voltage (e.g., −4V) and ground (e.g., 0V).

The first voltage (e.g., 5V) and the second voltage (e.g., −4V) are not simultaneously applied to the decoder such that no component of the decoder is subjected to more than a net operating voltage of 5.5V.

A gate control line (107) of the positive section (102) is connected to ground. Thus, when the polarity control signal on the input line (111) has the second voltage (e.g., −4V), the positive section (102) disconnects the output line (105) from the voltage lines (101 and 117) of the positive section (102).

Similarly, a gate control line (109) of the negative section (104) is connected to a predetermined voltage of 1.2V. Thus, when the polarity control signal has the first voltage (e.g., 5V), the negative section (104) disconnects the output line (105) from the voltage lines (103 and 119) of the negative section (104).

When the polarity control signal on the input line (111) has the first voltage (e.g., 5V), the positive section (102) connects the output line (105) to one of the voltage lines (101 and 117) of the positive section (102) based on a voltage applied on the first input line (113).

When the polarity control signal on the input line (111) has the second voltage (e.g., −4V), the negative section (104) connects the output line (105) to one of the voltage lines (103 and 119) of the negative section (104) based on a voltage applied on the second input line (115).

As illustrated in FIGS. 1-6, the decoder has no level shifting circuit and performs no pre-charging in operations.

Figure 8:
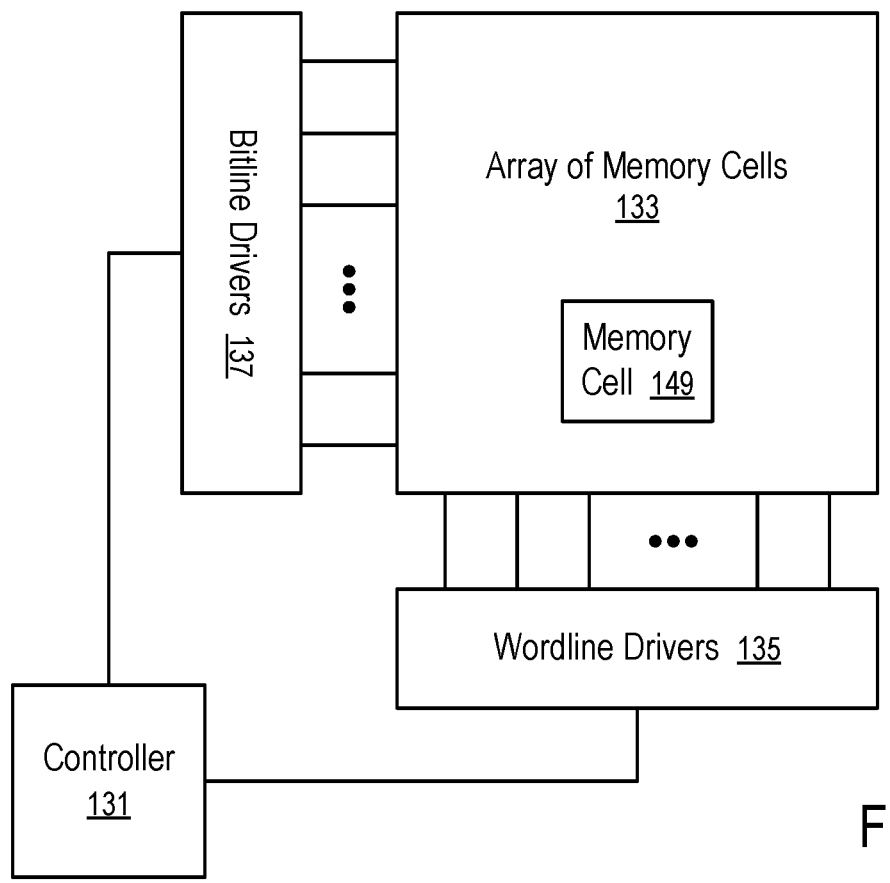
FIG. 8 shows a memory device configured with mux decoders according to one embodiment.

FIG. 8 shows a memory device configured with mux decoders according to one embodiment.

In FIG. 8, the memory device includes an array (133) of memory cells.

The memory device of FIG. 8 includes a controller (131) that operates bitline drivers (137) and wordline drivers (135) to access the individual memory cells (e.g., 149) in the array (133).

The bitline drivers (137) and/or the wordline drivers (135) can have, or be controlled by a decoder illustrated in FIGS. 1-6.

Figure 9:
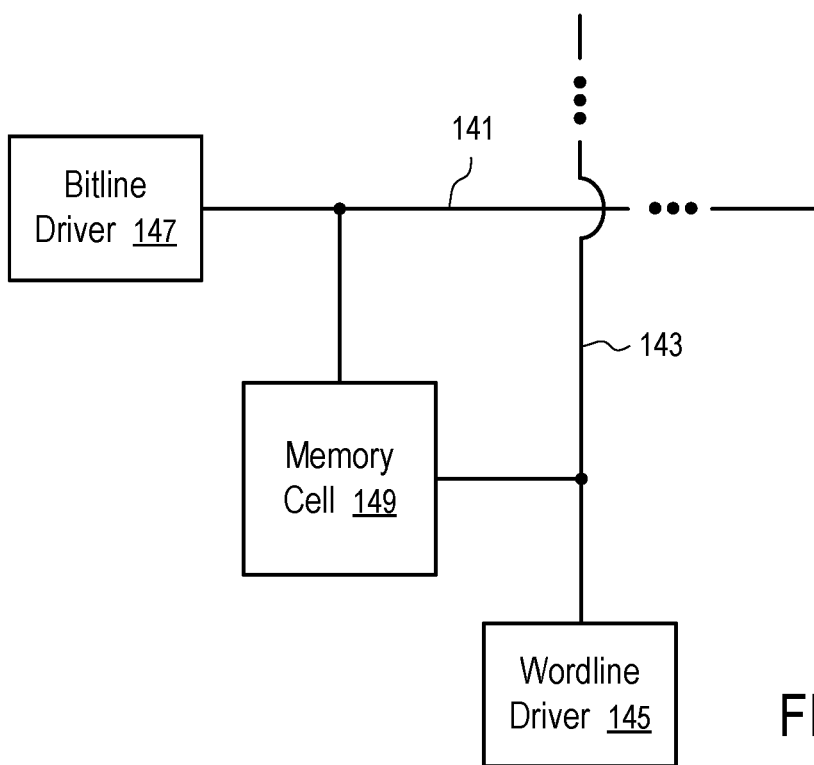
FIG. 9 shows a memory cell with a bitline driver and a wordline driver having mux decoders according to one embodiment.

Each memory cell (e.g., 149) in the array (133) can be accessed via voltages driven by a pair of a bitline driver and a wordline driver, as illustrated in FIG. 9.

FIG. 9 shows a memory cell with a bitline driver (147) and a wordline driver (145) having mux decoders according to one embodiment.

For example, the bitline driver (147) drives on a wire (141) a first voltage applied to a row of memory cells in the array (133); and the wordline driver (145) drives on a wire (143) a second voltage applied to a column of memory cells in the array (133). A memory cell (149) in the row and column of the memory cell array (133) is subjected to the voltage difference between the first voltage driven by the bitline driver (147) and the second voltage driven by the wordline driver (145). When the first voltage is higher than the second voltage, the memory cell (149) is subjected to one voltage polarity (e.g., positive polarity); and when the first voltage is lower than the second voltage, the memory cell (149) is subjected to an opposite voltage polarity (e.g., negative polarity).

At least one of the bitline driver (147) and the wordline driver (145) can configured as a driver controlled by a decoder illustrated in FIGS. 1-6.

For example, when the memory cell (149) is to be selected, the bitline driver (147) drives a positive high voltage (e.g., 4V) in one polarity and a negative high voltage (e.g., −4V) in the opposite polarity. Similarly, the wordline driver (145) drives a negative high voltage (e.g., −4V) in one polarity and a positive high voltage (e.g., 4V) in the opposite polarity.

For example, when the memory cell (149) is to be de-selected, the bitline driver (147) drives a low voltage (e.g., 0V) in one polarity and a low voltage (e.g., 0V) in the opposite polarity. When the bitline driver (147) drives a low voltage, the wordline driver (145) may drive a high voltage, or drive a low voltage.

Similarly, when the memory cell (149) is to be de-selected, the wordline driver (145) drives a low voltage (e.g., 0V) in one polarity and a low voltage (e.g., 0V) in the opposite polarity. When the wordline driver (145) drives a low voltage, the bitline driver (147) may drive a high voltage, or drive a low voltage.

For example, the bitline drivers (137) can be used to drive parallel wires (e.g., 141) arranged in one direction and disposed in one layer of cross point memory; and the wordline drivers (135) can be used to drive parallel wires (e.g., 143) arranged in another direction and disposed in another layer of the cross point memory. The wires (e.g., 141) connected to the bitline drivers (e.g., 147) and the wires (e.g., 143) connected to the wordline drivers (e.g., 145) run in the two layers in orthogonal directions. The memory cell array (133) is sandwiched between the two layers of wires; and a memory cell (e.g., 149) in the array (133) is formed at a cross point of the two wires (e.g., 141 and 143) in the integrated circuit die of the cross point memory.

The present disclosure includes methods and apparatuses which perform the methods described above, including data processing systems which perform these methods, and computer readable media containing instructions which when executed on data processing systems cause the systems to perform these methods.

The memory device of FIG. 8 can be used in a data processing system.

A typical data processing system may include an inter-connect (e.g., bus and system core logic), which interconnects a microprocessor(s) and memory. The microprocessor is typically coupled to cache memory.

The inter-connect interconnects the microprocessor(s) and the memory together and also interconnects them to input/output (I/O) device(s) via I/O controller(s). I/O devices may include a display device and/or peripheral devices, such as mice, keyboards, modems, network interfaces, printers, scanners, video cameras and other devices known in the art. In one embodiment, when the data processing system is a server system, some of the I/O devices, such as printers, scanners, mice, and/or keyboards, are optional.

The inter-connect can include one or more buses connected to one another through various bridges, controllers and/or adapters. In one embodiment the I/O controllers include a USB (Universal Serial Bus) adapter for controlling USB peripherals, and/or an IEEE-1394 bus adapter for controlling IEEE-1394 peripherals.

The memory may include one or more of: ROM (Read Only Memory), volatile RAM (Random Access Memory), and non-volatile memory, such as hard drive, flash memory, etc.

Volatile RAM is typically implemented as dynamic RAM (DRAM) which requires power continually in order to refresh or maintain the data in the memory. Non-volatile memory is typically a magnetic hard drive, a magnetic optical drive, an optical drive (e.g., a DVD RAM), or other type of memory system which maintains data even after power is removed from the system. The non-volatile memory may also be a random access memory.

The non-volatile memory can be a local device coupled directly to the rest of the components in the data processing system. A non-volatile memory that is remote from the system, such as a network storage device coupled to the data processing system through a network interface such as a modem or Ethernet interface, can also be used.

In the present disclosure, some functions and operations are described as being performed by or caused by software code to simplify description. However, such expressions are also used to specify that the functions result from execution of the code/instructions by a processor, such as a microprocessor.

Alternatively, or in combination, the functions and operations as described here can be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

While one embodiment can be implemented in fully functioning computers and computer systems, various embodiments are capable of being distributed as a computing product in a variety of forms and are capable of being applied regardless of the particular type of machine or computer-readable media used to actually effect the distribution.

At least some aspects disclosed can be embodied, at least in part, in software. That is, the techniques may be carried out in a computer system or other data processing system in response to its processor, such as a microprocessor, executing sequences of instructions contained in a memory, such as ROM, volatile RAM, non-volatile memory, cache or a remote storage device.

Routines executed to implement the embodiments may be implemented as part of an operating system or a specific application, component, program, object, module or sequence of instructions referred to as "computer programs." The computer programs typically include one or more instructions set at various times in various memory and storage devices in a computer, and that, when read and executed by one or more processors in a computer, cause the computer to perform operations necessary to execute elements involving the various aspects.

A machine readable medium can be used to store software and data which when executed by a data processing system causes the system to perform various methods. The executable software and data may be stored in various places including for example ROM, volatile RAM, non-volatile memory and/or cache. Portions of this software and/or data may be stored in any one of these storage devices. Further, the data and instructions can be obtained from centralized servers or peer to peer networks. Different portions of the data and instructions can be obtained from different centralized servers and/or peer to peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

Examples of computer-readable media include but are not limited to non-transitory, recordable and non-recordable type media such as volatile and non-volatile memory devices, read only memory (ROM), random access memory (RAM), flash memory devices, floppy and other removable disks, magnetic disk storage media, optical storage media (e.g., Compact Disk Read-Only Memory (CD ROM), Digital Versatile Disks (DVDs), etc.), among others. The computer-readable media may store the instructions.

The instructions may also be embodied in digital and analog communication links for electrical, optical, acoustical or other forms of propagated signals, such as carrier waves, infrared signals, digital signals, etc. However, propagated signals, such as carrier waves, infrared signals, digital signals, etc. are not tangible machine readable medium and are not configured to store instructions.

In general, a machine readable medium includes any mechanism that provides (i.e., stores and/or transmits) information in a form accessible by a machine (e.g., a computer, network device, personal digital assistant, manufacturing tool, any device with a set of one or more processors, etc.).

In various embodiments, hardwired circuitry may be used in combination with software instructions to implement the techniques. Thus, the techniques are neither limited to any specific combination of hardware circuitry and software nor to any particular source for the instructions executed by the data processing system.

The above description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A decoder in an integrated circuit memory device, the decoder comprising:
    a positive section having a first input line;
    a negative section having a second input line; and
    an output line connected from both the positive section and the negative section to a voltage driver connected to a memory cell;
    wherein the positive section and the negative section are controlled by a polarity control signal;
    wherein when the polarity control signal indicates positive polarity, the positive section drives the output line according to signals received in the first input line; and
    wherein when the polarity control signal indicates negative polarity, the negative section drives the output line according to signals received in the second input line;
    wherein when the polarity control signal indicates positive polarity, the positive section is powered by a positive power voltage and the decoder is not connected to a negative power voltage; and
    wherein when the polarity control signal indicates positive polarity, the positive section is connected between the positive power voltage at a first voltage line and ground at a second voltage line; and the negative section is connected between ground at a third voltage line and ground at a fourth voltage line.

2. The decoder of claim 1, wherein when the polarity control signal indicates negative polarity, the positive section is connected between ground at the first voltage line and ground at the second voltage line; and the negative section is connected between the negative power voltage at the third voltage line and ground at the fourth voltage line.

3. The decoder of claim 2, wherein the negative power voltage is −4V; the positive power voltage is 5V; and when the polarity control signal is at the negative power voltage to indicate negative polarity, the decoder is not connected to the positive power voltage.

4. The decoder of claim 3, wherein a gate in the positive section is biased at ground to disconnect the output line from the first and second voltage lines when the polarity control signal is at the negative power voltage to indicate negative polarity.

5. The decoder of claim 4, wherein a gate in the negative section is biased at a predetermined voltage of 1.2V to disconnect the output line from the third and fourth lines when the polarity control signal is at the positive power voltage to indicate positive polarity.

6. The decoder of claim 5, wherein when the polarity control signal is at the negative power voltage, the negative section connects the output line to one of the third and fourth voltage lines according to a signal received on the second input line.

7. The decoder of claim 5, wherein when the polarity control signal is at the positive power voltage, the positive section connects the output line to one of the first and second voltages lines according to a signal received on the first input line.

8. The decoder of claim 5, wherein the decoder has no level shifting circuit.

9. The decoder of claim 5, wherein the decoder performs no pre-charging in operations.

10. A method, comprising:
connecting a polarity control signal to a decoder in an integrated circuit memory device, the decoder having a positive section having a first input line and a negative section having a second input line; and
connecting an output line of the decoder from both the positive section and the negative section to a voltage driver for a memory cell in the integrated circuit memory device;
responsive to the polarity control signal having a first voltage, driving by the positive section the output line according to a signal received in the first input line;
responsive to the polarity control signal having a second voltage, driving by the negative section the output line according to a signal received in the second input line;
powering the positive section by a first voltage difference between a first voltage and ground, when the polarity control signal has the first voltage; and
powering the negative section a second voltage difference between the second voltage and ground, when the polarity control signal has the second voltage.

11. The method of claim 10, wherein the first voltage is 5V; the second voltage is −4V; and the first voltage and the second voltage are not simultaneously applied to the decoder.

12. The method of claim 11, further comprising:
connecting a gate control line of the positive section at ground, causing when the polarity control signal has the second voltage, the positive section to disconnect the output line from voltage lines of the positive section, wherein the first voltage difference is applied on the voltage lines when the polarity control signal has the first voltage.

13. The method of claim 11, further comprising:
connecting a gate control line of the negative section at a predetermined voltage, causing when the polarity control signal has the first voltage, the negative section to disconnect the output line from voltage lines of the negative section, wherein the second voltage difference is applied on the voltage lines when the polarity control signal has the second voltage.

14. A memory device, comprising:
a controller;
a first set of parallel wires disposed in a first layer of an integrated circuit die;
a second set of parallel wires disposed in a second layer of the integrated circuit die;
a first set of voltage drivers connected to the first set of parallel wires respectively;
a second set of voltage drivers connected to the second set of parallel wires respectively; and
an array of memory cells formed between the first layer and the second layer, wherein each respective memory cell is at a cross point of a wire in the first layer and a wire in the second layer;
wherein each respective voltage driver in the first and second sets of voltage drivers has a decoder;
wherein the decode comprises:
a positive section having a first input line;
a negative section having a second input line;
an output line connected from both the positive section and the negative section to provide control signals for the voltage driver; and
a control line connecting a polarity control signal to the positive section and the negative section;
wherein a voltage level at the output line is controlled by the positive section in accordance with a voltage applied on the first input line when the polarity control signal has a first voltage; and
wherein the voltage level at the output line is controlled by the negative section in accordance with a voltage applied on the second input line when the polarity control signal has a second voltage.

15. The memory device of claim 14, wherein the respective memory cell has a select device and no phase-change memory device; the memory cell is programmable to store data via applying pulses with opposite polarity; and during an operation to read the memory cell, voltages of a predetermined, fixed polarity are applied on the memory cell.

16. The memory device of claim 15, wherein the first voltage is 5V; the second voltage is −4V; when the polarity control signal has the first voltage, voltage lines of the positive section are connected to the first voltage and ground, while voltage lines of the negative section are both connected to ground; and when the polarity control signal has the second voltage, the voltage lines of the negative section are connected to the second voltage and ground, while the voltage lines of the positive section are both connected to ground.

17. The memory device of claim 16, wherein a gate control line of the positive section is connected to ground; a gate control line of the negative section is connected to a predetermined voltage; when the polarity control signal has the first voltage, the negative section disconnects the output line from the voltage lines of the negative section; and when the polarity control signal has the second voltage, the positive section disconnects the output line from the voltage lines of the positive section.

* * * * *